United States Patent [19]

Kusters et al.

[11] 4,160,183

[45] Jul. 3, 1979

[54] OSCILLATOR HAVING A QUARTZ RESONATOR CUT TO COMPENSATE FOR STATIC AND DYNAMIC THERMAL TRANSIENTS

[75] Inventors: John A. Kusters, Cupertino, Calif.; Jerry G. Leach, Snyder, Tex.; Michael C. Fischer, Santa Clara, Calif.

[73] Assignee: Hewlett-Packard Company, Palo Alto, Calif.

[21] Appl. No.: 910,044

[22] Filed: May 26, 1978

[51] Int. Cl.² ............................................. H01L 41/10
[52] U.S. Cl. ..................... 310/315; 310/318; 310/361; 331/116 R
[58] Field of Search ............... 310/315, 316, 317, 318, 310/361, 312; 331/116 R, 153, 154; 73/339 A

[56] References Cited

U.S. PATENT DOCUMENTS

| | | | |
|---|---|---|---|
| 1,907,427 | 5/1933 | Marrison | 310/315 X |
| 1,915,368 | 6/1933 | Lack | 310/315 X |
| 3,349,348 | 10/1967 | Ice | 310/315 X |
| 3,719,838 | 3/1973 | Peduto et al. | 310/315 |
| 3,826,931 | 7/1974 | Hammond | 310/315 X |
| 3,879,992 | 4/1975 | Bartera | 310/312 X |
| 3,882,332 | 5/1975 | Frymoyer | 310/318 |

*Primary Examiner*—Mark O. Budd
*Attorney, Agent, or Firm*—Allston L. Jones

[57] ABSTRACT

A method and apparatus utilizing a quartz crystal resonator with an orientation substantially equal to (yxwl) 21.93°/33.93° vibrating simultaneously in two thickness modes to provide a stable frequency signal source. By combining a quartz crystal resonator of the above type with either digital or analog compensation, the frequency-temperature deviation of one of the crystal mode frequencies is used as an internal thermometer and the second crystal mode frequency as a reference frequency signal. The frequency signal for the thermometer function is utilized by the compensation network to stabilize the frequency of the reference signal. Additionally, the analog or digital compensation is accomplished by means of either a curve-fitting routine or an interpolation look-up table routine.

10 Claims, 3 Drawing Figures

OSCILLATOR HAVING A QUARTZ RESONATOR CUT TO COMPENSATE FOR STATIC AND DYNAMIC THERMAL TRANSIENTS

CROSS REFERENCE TO RELATED APPLICATION

This application is related to U.S. Pat. No. 4,079,280 entitled "Quartz Resonator Cut to Compensate for Static and Dynamic Thermal Transients" which issued on Mar. 14, 1978, to the same inventors and assignee as those for this application.

BACKGROUND OF THE INVENTION

The resonant frequency of a quartz crystal is dependent on the elastic coefficients, the density, the thickness and overtone operation of the crystal. In addition, each of these factors vary with changes in the ambient temperature of the crystal, and, thus, resonant frequency variations occur.

Conventional methods for making the frequency of a quartz crystal resonator minimally dependent on temperature variations included three approaches. The first approach utilizes a heated oven to control the ambient temperature of the crystal resonator and thus control the frequency of that crystal. To further improve the frequency-temperature performance, the crystal resonator will typically be cut in one of the thermally compensated orientations for which the crystal resonator has inherently good frequency stability over a narrow temperature range. Two widely used singly rotated orientations are the AT and BT.

This approach generally yields crystal resonator controlled oscillators exhibiting the highest frequency stability currently obtainable. However, this approach experiences three potential drawbacks. First, in modern crystal resonator controlled applications, the oven will be the predominant power user. Second, a thermal stabilization time of many minutes is required when the crystal oven is first turned on even when available power is not limited. A large portion of this time is necessary to allow thermal gradients in the resonator to equilibrate and thus the advantage of instant warm up of transistor circuits is lost. Third, optimum temperature control of the quartz resonators is not possible unless the actual temperature of the quartz plate is known. Because the thermal sensing element is not in intimate contact with the resonator, errors in ambient control degrade frequency stability.

The second and third approaches utilize temperature compensation without the use of the oven. VCXO's (Voltage Controlled Crystal Oscillators) and TCXO's (Temperature Controlled Crystal Oscillators) represent the second approach. The VXCO typically includes a combination of a crystal resonator, an amplifier, and a voltage variable phase shifter. The voltage which is applied to the variable phase shifter represents a feedback signal derived from some form of temperature sensor, usually a thermistor or thermistor bridge, although more elaborate methods are possible.

The TXCO includes in the crystal resonator feedback path carefully selected reactive components which are not voltage variable, but which have a temperature-characteristic response which exactly compensates for the temperature behavior of the crystal resonator resulting in a device exhibiting a minimal frequency-temperature dependence.

The third approach utilizes novel characteristics of crystal resonators to obtain temperature compensation without the use of an oven. U.S. Pat. No. 3,826,931 entitled "Dual Crystal Resonator Apparatus" filed in the name of Donald L. Hammond and issued on July 30, 1974, describes a resonator apparatus which utilizes either a single quartz crystal vibrating in two selected modes or two quartz crystals each vibrating in a single selected mode to form a resonator output frequency that is the sum or difference of the two crystal frequencies and is minimally temperature dependent.

All three approaches experience a significant drawback. The temperature compensation described is static compensation, that is, temperature compensation is achieved only under conditions where the ambient temperature is slowly changing. Rapidly changing temperatures sufficient to cause thermal gradients through the crystal resonator, cause instantaneous frequency shifts orders of magnitude greater than the static stability of the device. For example, the AT cut resonator in an oven can have short term stabilities which are several parts in $10^{10}$. However, a 1° C. temperature gradient through the crystal resonator can cause a sudden frequency shift of 36 parts in $10^6$.

Dynamic compensation for thermal transients was recently discovered by Richard Holland. He predicted a doubly-rotated crystal resonator cut, the TS, that has an orientation of (yxwl) 22.8°/34.3° (ANSI C83.3–1951 (R1972)) which exhibits inherently good frequency stability over a narrow temperature range suitable for obtaining good static compensation using either of the first two approaches discussed previously, and at the same time has inherent dynamic compensation for temperature transients. The TS orientation was introduced by Richard Holland in the following publications:

Richard Holland, "Nonuniformly Heated Anisotropic Plates: I. Mechanical Distortion and Relaxation", *IEEE Transactions on Sonics and Ultrasonics,* Vol. SU-21, July 1974, pp. 171–178, and Richard Holland, "Nonuniformly Heated Anisotropic Plates: II. Frequency Transients in AT and BT Quartz Plates," 1974 *Ultrasonics Symposium Proceedings,* IEEE Cat. #74CHO 896-15U, pp. 592–598.

At essentially the same time, another doubly-rotated crystal resonator cut, the SC, was predicted by Earl Eer Nisse to be (yxwl) 22.5°/34.3°, which is essentially the same as that predicted by Richard Holland. The SC orientation was introduced by Earl Eer Nisse in the following publication:

Earl E. Nisse, "Quartz Resonator Frequency Shifts Arising from Electrode Stress," *Proceedings of the 29th Annual Symposium on Frequency Control* 1975, U.S. Army Electronics Command, Fort Monmouth, N.J., May 28–30, 1975.

This cut exhibits the necessary frequency-temperature stability over narrow temperature ranges to obtain good static compensation with either the first or second approach. In addition, the SC is claimed to be frequency independent of internal stresses in the crystal resonator caused by deposited electrode patterns, crystal resonator mounts, and external applied stress in the plane of the crystal resonator surface. Both of these orientations offer thermal and mechanical stress sensitivity improvements over the AT and BT orientations but they still require operation in a controlled temperature environment over a narrow temperature range to achieve good frequency stability.

SUMMARY OF THE INVENTION

The present invention includes a quartz crystal resonator with an orientation substantially equal to (yxwl) 21.93°/33.93° vibrating in two thickness modes simultaneously, and an analog or digital compensation network to provide accurate temperature or frequency measurements, or a stable reference frequency signal without the necessity of an oven or ancillary temperature monitoring devices.

To accomplish this, the frequency-temperature deviation characteristic of one of the thickness mode vibrations is used as a thermometer and the second mode frequency signal is used as a reference frequency signal or as the frequency stabilized output signal. In the illustrated embodiment of the invention, both of the mode signals are applied to the particular compensation network.

In the embodiment of the present invention, one of the resonator mode frequencies is stabilized against temperature induced frequency variations so that this signal is a stabilized frequency output signal. This is accomplished in a closed feedback circuit wherein the thermometer signal, whether it is one of the corresponding mode signal or a combination of both signals, is measured and this measurement is used to determine the phase shift necessary to correct the C mode frequency. To accomplish this, the determined phase shift is converted to an appropriate signal for application to a variable phase shifter which is coupled to one or both of the B and C mode oscillator amplifiers to produce the necessary phase shift.

DESCRIPTION OF THE PREFERRED EMBODIMENT

Investigations have shown that by using a crystal oriented within two degrees of (yxwl) 21.93°/33.93° and operating in the fast shear, or B mode, and the slow shear, or C mode, the operation of the crystal resonator is both statically and dynamically thermally compensated in the region of the crystal turnover temperature. This crystal can be referred to as being a TTC (Thermal Transient Compensated) type. It is widely known that the frequency-temperature behavior of any precision cut quartz resonator can be well represented by a power series expansion.

A crystal of the above orientation has a frequency-temperature curve wherein the contribution of the fourth and higher order terms is typically less than one part in $10^8$, over a temperature range of 200° C. The shape of this curve can be expressed algebraically as:

$$f = f_o[1 + aT + bT^2 + cT^3] \tag{1}$$

where $f_o$ is the resonant frequency at a selected reference temperature, a, b, and c are first, second and third order temperature coefficients of frequency, and T is the value of the actual crystal temperature minus the value of the selected reference temperature.

It is well known that crystal orientations exist for which a single crystal can be driven to cause the crystal to vibrate in a plurality of thickness modes simultaneously. This is possible since the three thickness modes of motion are orthogonal and can exist simultaneously without mutually interfering with each other.

Figure 1:
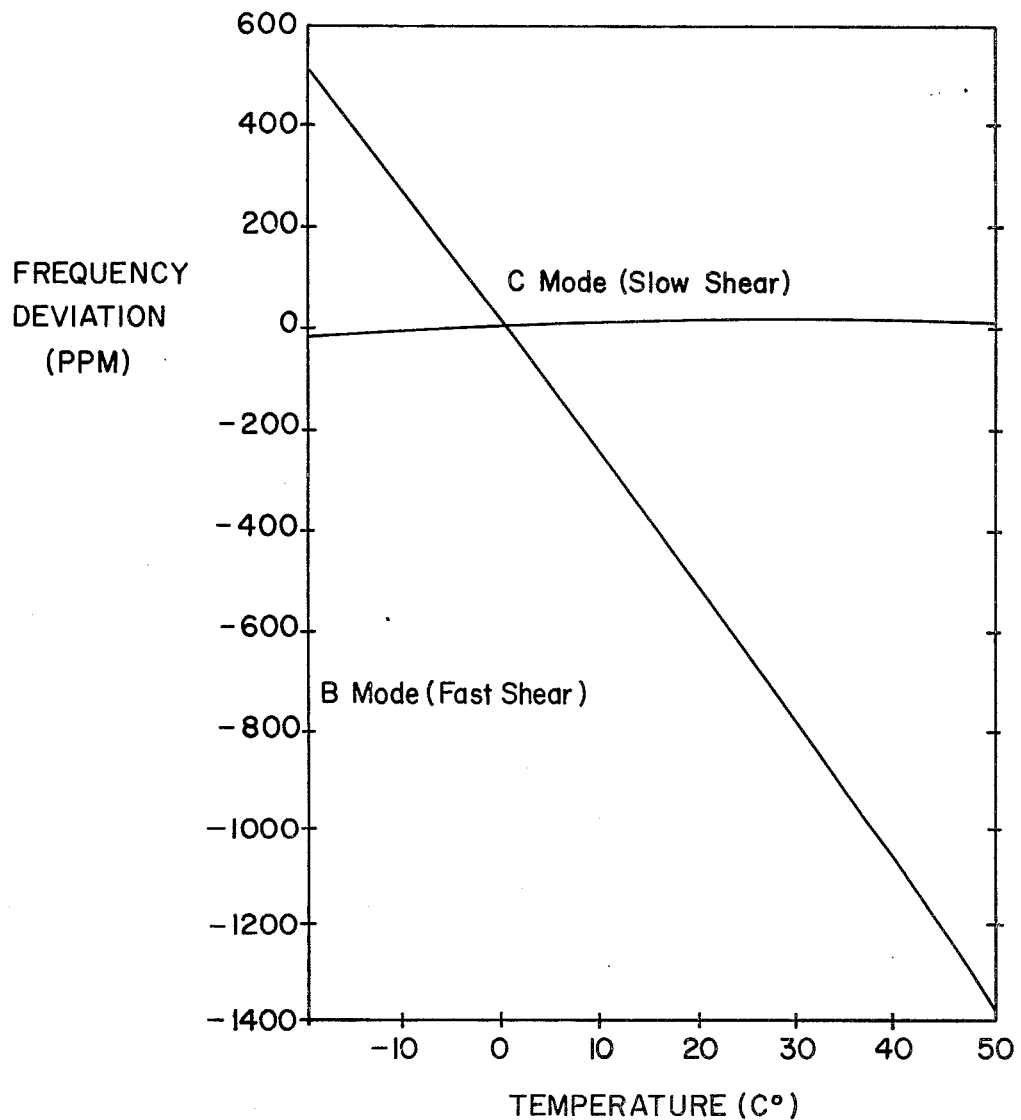
FIG. 1 is a plot of the frequency deviation versus temperature for the B and C mode frequencies of a quartz crystal resonator of the (yxwl) 21.93°/33.93° orientation.

FIG. 1 shows a representative plot of the temperature-frequency deviation of the B (fast shear) and C (slow shear) modes of a quartz resonator of the (yxwl) 21.93°/33.93° orientation. These temperature-frequency deviation curves show that the B mode frequency variation is predominantly linear and the C mode frequency variation is predominantly third order over the 70° Celsius range of FIG. 1. These frequency variations are approximately 1900 PPM (parts per million) for the B mode frequency and 25 PPM for the C mode frequency.

In a crystal resonator of this type, the B mode frequency variations can be used to sense the plate temperature of the crystal and thus provide a means whereby errors caused by the temperature sensitivity of the C mode frequency can be corrected when the C mode frequency is used as a frequency or time base reference or a frequency source.

Any of these applications can be achieved by utilizing a curve fitting routine, or a look-up table and interpolation. In either of the curve fitting or look-up table implementations, the initial step is to measure both the B and C mode frequencies at selected temperatures over the required operating range. These values can then be used to either derive the coefficients of the selected curve fitting expression, or to determine individual entries for a look-up table at each of the selected temperatures.

In a curve fitting implementation, the C mode frequency signal of the resonator can be used as the time base signal for measuring the frequency value of a second selected frequency signal.

Since the C mode frequency varies with temperature variations, the measured frequency will be incorrect. The relative error of the measured signal can be defined as:

$$\delta f = \frac{f_s - f_{st}}{f_{st}} \tag{2}$$

where $f_s$ is the measured value of the selected frequency signal and $f_{st}$ is the true value of the same signal.

The true value of this signal can be expressed as:

$$f_{st} = \frac{f_s}{1 + \delta f} \tag{3}$$

By means of known frequency counter principles (Hewlett-Packard Company Application Note 172), the relative error of the C mode frequency signal is equivalent to $\delta f$ and can be expressed as:

$$\delta f = \frac{f_c - f_{Co}}{f_{Co}} \tag{4}$$

where $f_C$ is the frequency value of the C mode signal at the operating temperature of the TTC crystal and $f_{C_o}$ is the selected reference frequency of the C mode frequency signal.

The actual frequency of the C mode time base can be expressed as a polynomial in temperature as:

$$f_C = f_{C_o}(1 + A_C T + B_C T^2 + C_C T^3 + \ldots) \tag{5}$$

where $A_C, B_C, C_C, \ldots$, are the first, second, third, ..., order temperature coefficients of frequency and T is normalized temperature. By substituting $f_C$ of equation 5 into equation 4, the error expression becomes $$\delta f = A_C T + B_C T^2 + C_C T^3 + \ldots \tag{6}$$

The resultant value from equation 6 can then be inserted into equation 3 to determine the true frequency of the selected frequency signal, or to stabilize the frequency of the C mode frequency by performing the following calculation:

$$f_{C_o} = \frac{f_C}{1 + \delta f}. \tag{7}$$

Therefore, by knowing the appropriate coefficients and the normalized temperature, T, the correction factor can be computed and either equation 3 used to derive the correct measured frequency, or equation 4 used to correct the system output frequency.

The TTC crystal has essentially a built-in thermometer in the B-mode response. This is predominantly a linear temperature coefficient mode with a slope large enough so that $f_B - f_C$ (the difference in the two mode frequencies) is always positive and single valued.

In the proposed implementation, the true B-mode frequency, $f_{B_T}$, can be measured using the actual C-mode frequency, $f_c$, as a time base. This of course gives rise to an error in the measured frequency, $f_B$. The relative error again is identical and is given by:

$$\delta f = \frac{f_B - f_{B_T}}{f_{B_T}}. \tag{8}$$

After selecting a reference frequency, $f_{C_o}$, we can measure $f_B$ and $f_C$ as a function of temperature using a precision time base, and then construct a table of the apparent $f_B$ if measured with $f_C$ as a time base by using equations 4 and 8 to form:

$$f_B(T) = f_{B_T}(T)\left\{1 + \frac{f_C(T) - f_{C_o}}{f_{C_o}}\right\}. \tag{9}$$

We now have a table of the apparent $f_B$ frequencies versus a normalized temperature, T. Therefore, a polynomial can be constructed which has the form:

$$T = A' + B' f_B + C' f_B^2 + D' f_B^3 + \ldots \tag{10}$$

where $A', B', C', D', \ldots$ are the zeroth, first, second, third ... order frequency coefficients of temperature.

This expression can then be substituted into equation 6 yielding an expression of the following form:

$$\delta f = A + B f_B + C f_B^2 + D f_B^3 + \ldots \tag{11}$$

Hence, by measuring the B-mode frequency signal using the C-mode signal as a frequency base, a correction factor polynomial valid over the entire calibration range can be generated. This correction factor can then be used with either of equations 3 or 4 to correct the measured value of the selected frequency signal, or to stabilize the C mode frequency signal by shifting its frequency as necessary, respectively.

To implement the curve-fitting technique, the coefficients of equation 10 or 11 are determined initially for the individual crystal or for a production class of crystals, and stored in the apparatus as fixed constants over the entire operational temperature range. In operation, $f_B$ which can be the B mode frequency or a selected first order function of both the B and C mode frequencies, e.g., the ratio or difference, is formed, measured, and applied to a processor wherein signals representative of the expressions of equation 10 or 11 are formed and added to form yet another signal that is representative of the crystal temperature or the desired correction factor.

In the look-up table technique, the value of the desired correction factor or of the temperature is initially stored in the look-up table with $f_B$, the value of the B mode frequency or of a selected function of both the B and C mode frequencies, as a pointer at each selected temperature. In operation, $f_B$ is formed and measured to generate a pointer to the desired information in the look-up table. If the value of $f_B$ is the same as one of the pointers of the look-up table, the information stored at that location is transfered to a processor. The value of $f_B$ may be between two pointer values of the look-up table. When this occurs, the look-up table values associated with these adjacent pointers are transfered to the processor where an appropriate interpolation is performed to determine the value of the temperature or correction factor associated with this intermediate pointer.

The interpolation technique used when the value of the pointer is intermediate two other pointer values in many applications will be linear. This then requires that the initial measurements of the crystal frequencies be taken at selected temperatures which are sufficiently close together such that the desired correction factor or temperature curves as a function of $f_B$ between these temperature values are predominantly linear. If these curves are non-linear between the selected temperatures, it then would be necessary to include polynomial coefficients in the look-up table for each pointer. These coefficients would then be used in any known interpolation polynomial to determine the correction factor for the intermediate pointer.

Figure 2:
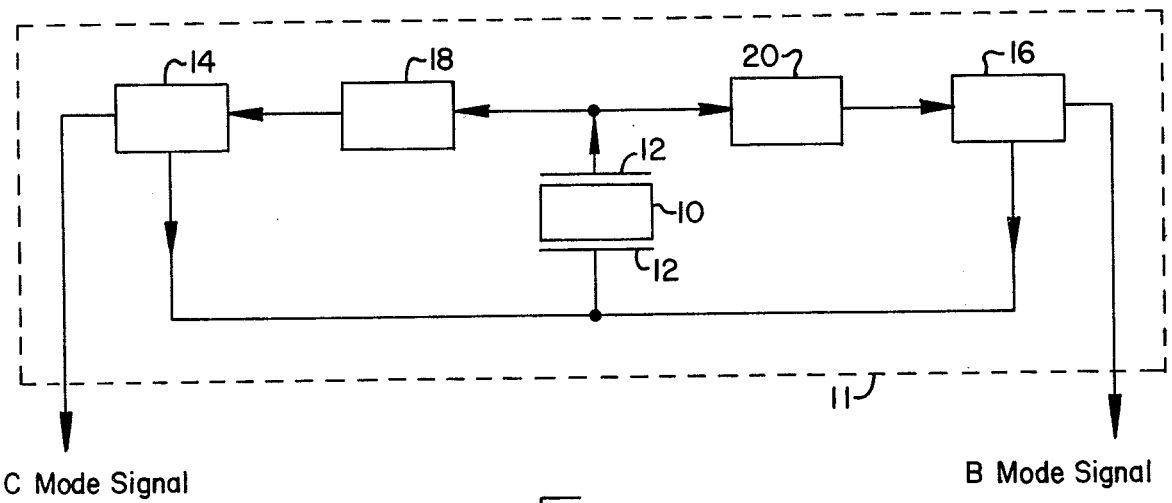
FIG. 2 is a block diagram representation of an oscillator implementation wherein the included quartz crystal resonator is excited to vibrate in two thickness modes simultaneously.
Figure 3:
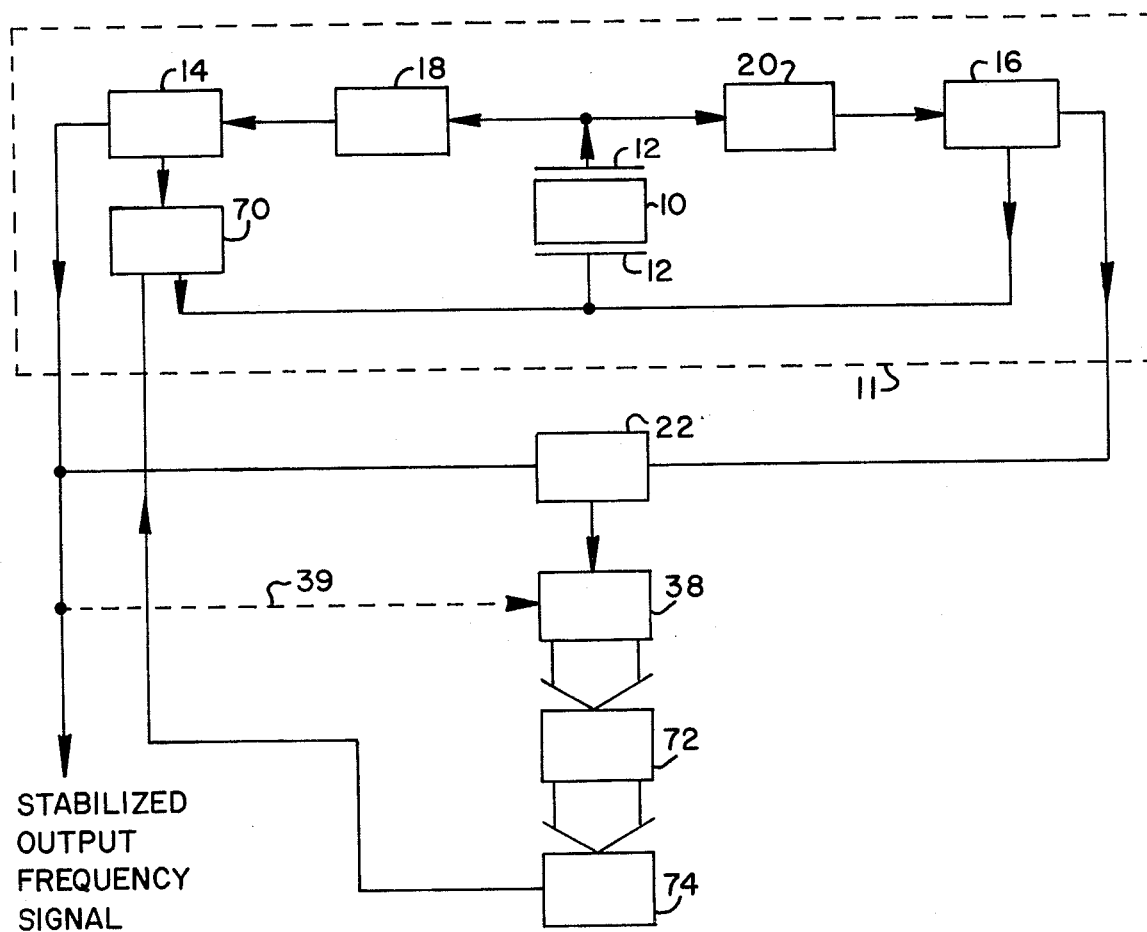
FIG. 3 is a block diagram of the preferred embodiment of the present invention wherein a varactor is utilized to shift the phase of the C mode frequency from the oscillator in a closed-loop feedback network embodiment to stabilize the frequency of the C mode signal.

In FIGS. 2 and 3, the arrows which are shown, indicate the direction of forward power or information flow.

Referring now to FIG. 2, there is shown an oscillator 11 wherein a doubly rotated TTC quartz crystal resonator 10 is vibrating in two thickness modes simultaneously. Oscillator 11 includes a single quartz resonator 10 of the TTC type discussed above, disposed between electrodes 12 and vibrated simultaneously in its B and C modes by application of an A-C signal to electrodes 12 by amplifiers 14 and 16. This circuit configuration is designed to excite a separate mode of vibration within resonator 10 with amplifiers 14 and 16 corresponding to the C and B mode frequencies, respectively. Also included are filter networks 18 and 20, each having appropriate poles and/or zeros relative to the C and B mode frequencies to separate the energy from the variation in the two modes of the single pair of electrodes 12. In this configuration, the C and B mode frequency signals are provided for subsequent circuitry from amplifiers 14 and 16 respectively.

The embodiment shown in FIG. 3 is a closed feedback loop compensation arrangement wherein the C mode frequency signal of resonator 10 is controlled to produce a stable output signal. This embodiment incorporates a dual frequency oscillator 11, a mixer 22, a frequency measuring subsystem 38, a processor 72, a converter 74 (e.g., Analog Device AD 7521JN), and a voltage-variable phase shifter 70 (e.g., a varactor). Oscillator 11 is of the type shown in FIG. 2 with voltage-variable phase shifter 70 connected serially between amplifier 14 and lower electrode 12 in place of the connection between those elements of oscillator 11. Phase shifter 70 could alternately be located in any appropriate location in oscillator 11, e.g., connected serially between lower electrode 12 and both of amplifiers 14 and 16 in place of the common path from each of amplifiers 14 and 16 and lower electrode 12. The B and C mode frequency signals of oscillator 11 are next coupled to mixer 22. From these signals, mixer 22 produces a difference signal, $f_D$, which is then applied to frequency measuring subsystem 38 (e.g., Hewlett-Packard Model 5300B). Frequency measuring subsystem 38 consists of conventional digital binary circuitry, analog frequency to voltage conversion circuitry, or a combination of analog-digital tachometric circuitry. This frequency measuring subsystem may require a reference frequency in which case the resultant measurement is the ratio between the reference frequency and the measured frequency. Should a reference frequency signal input be utilized, it could be the C mode frequency signal as indicated by dashed line 39.

Frequency measuring subsystem 38 in turn generates a first electrical signal corresponding to the measured difference frequency, $f_D$. The first electrical signal is coupled to processor 72 to generate a correction control signal to correct for the C mode frequency drift of resonator 10 with changes in temperature.

Processor 72 can be implemented to apply either the curve fitting technique or the look-up table technique as discussed above with digital or analog circuits. Examples of these various implementations are:

Digital curve fitting processor 72—Fairchild F8
Analog curve fitting processor 72—Operational amplifiers with non-linear function generators composed of resistors, diodes and transistors
Digital look-up table processor 72—Hewlett-Packard Model 9825A
Analog look-up table processor 72—Operational amplifiers and multiple threshold circuits with resitive ladders The correction factors preprogrammed into processor 72 correct for the non-linear variations of the C mode frequency of resonator 10 and the potential non-linear variation of the phase shift produced by the voltage-variable phase shifter 70. This correcting electrical signal is representative of the control voltage necessary to maintain the frequency of the output signal from amplifier 14 within the selected tolerance (e.g., one part in one hundred million). The correction output signal of processor 72 is applied to converter 74 to convert that signal to an appropriate format (e.g., ditigal-to-analog conversion, or voltage translation) for application to variable voltage phase shifter 70 to complete the closed loop feedback path.

By utilizing the difference frequency signal developed by mixer 22, a control voltage signal is developed and fed back to voltage variable phase shifter 70 to change the total phase shift of the C mode frequency signal path by the desired amount to stabilize the frequency of the output signal from amplifier 14 to be the stabilized frequency output signal.

We claim:

1. Signal generation apparatus comprising:
a quartz crystal resonator having a selected crystallographic orientation that is equal to (yxwl) 21.93°/33.93°±2° for providing static and dynamic thermal transient compensation, and having first and second thickness modes of vibration in response to an electric field applied thereto, vibration in each of said modes being characterized by a selected frequency-temperature deviation characteristic;

oscillator means for generating and supplying said electric field to said quartz crystal resonator, for isolating the first and second frequency signals of said first and second modes of vibration, respectively, and for shifting the phase of at least one of said first and second frequency signals; and compensation means coupled to receive at least the other of said first and second frequency signals for production of a correction control signal for application to the oscillator means to control the phase shift necessary to stabilize the one of said first and second frequency signals for temperature induced frequency variations, the other of said first and second frequency signals received by the compensation means being representative of the temperature of said quartz crystal resonator and used to generate the correction control signal.

2. Signal generation apparatus as in claim 1 wherein:
said one of the first and second frequency signals and its corresponding thickness mode of vibration comprises the C mode frequency signal and its C mode of vibration of the quartz crystal resonator each having a predominantly third order frequency-temperature characteristic over a selected temperature range; and said other of the first and second frequency signals and its corresponding thickness mode of vibration comprises the B mode frequency signal and its B mode of vibration of the quartz crystal resonator each having a predominantly linear frequency-temperature characteristic over a selected temperature range.

3. Signal generation apparatus as in claim 2 wherein said compensation means comprises:
input means coupled to said oscillator means for receiving at least the B mode frequency signal of said B and C mode frequency signals and for providing a third signal whose frequency is representative of the internal temperature of the quartz crystal resonator;

frequency measuring means coupled to receive, and for measuring the frequency of said third signal and generating a fourth signal with an encoded value that is representative of the measured frequency value of the third signal; and processor means coupled to receive said fourth signal for producing therefrom a fifth signal with an encoded value that is a function of the temperature of the quartz crystal resonator, the fifth signal being said correction control signal.

4. Signal generation apparatus as in claim 3 wherein said processor means produces the fifth signal by a curve fitting technique.

5. Signal generation apparatus as in claim 3 wherein said processor means produces the fifth signal by a look-up table and interpolation technique.

6. A method of generating a signal, said method comprising the steps of:
   exciting a quartz crystal resonator having a selected crystallographic orientation that is equal to (yxwl) 21.93°/33.93°±2° for providing static and dynamic thermal transient compensation into simultaneous vibration in a first and a second independent thickness mode of vibration, vibration in each of said modes being characterized by a selected frequency-temperature deviation characteristic;
   isolating from each other a first and a second frequency signal corresponding to the first and the second mode of vibration respectively;
   generating from at least one of said first and second frequency signals a correction control signal with an encoded value that is dependent on the operating temperature of the quartz crystal resonator; and
   shifting the phase of at least the other of said first and second frequency signals in response to the correction control signal to stabilize said other signal against temperature induced frequency shifts.

7. A method of generating a signal as in claim 6 wherein:
   said one of the first and second frequency signals and its corresponding thickness mode of vibration comprises the B mode frequency signal and its B mode of vibration of the quartz crystal resonator each having a predominantly linear frequency-temperature characteristic over a selected temperature range; and
   said other of the first and second frequency signals and its corresponding thickness mode of vibration comprises the C mode frequency signal and its C mode of vibration of the quartz crystal resonator each having a predominantly third order frequency-temperature characteristic over a selected temperature range.

8. A method of generating a signal as in claim 7 wherein the step of generating a correction control signal includes:
   producing a third signal whose frequency is representative of the internal temperature of the quartz crystal resonator from at least one of the B and C mode frequency signals;
   counting the frequency of the third signal and generating a fourth signal with an encoded value that is representative of the counted frequency value of the third signal; and
   processing the fourth signal to produce a fifth signal wtih an encoded value that is a function of the temperature of the quartz crystal resonator, the fifth signal being said correction control signal.

9. A method of generating a signal as in claim 8 wherein the step of processing the fourth signal includes:
   predetermining and storing coefficients of an $n^{th}$ order polynomial that is a function of the encoded value of the fourth signal to accurately produce the encoded value of the fifth signal over the entire selected temperature range; and
   algebraically combining the encoded value of the fourth signal with the stored coefficients of the $n^{th}$ order polynomial to form the encoded value of the fifth signal.

10. A method of generating a signal as in claim 8 wherein the step of processing the fourth signal includes:
   predetermining the values to be encoded in each of the fourth and fifth signals with the quartz crystal resonator operating at a plurality of selected temperatures;
   prestoring the individual predetermined values to be encoded in the fifth signal in a storage device with the corresponding predetermined values of the fourth signal as pointers thereto;
   applying the actual encoded value of the fourth signal to the storage device;
   identifying a plurality of pointers having values between which the actual encoded value of the fourth signal falls; and
   interpolating between the stored values to be encoded into the fifth signal corresponding to said plurality of pointers utilizing the plurality of pointers and the actual value encoded in the fourth signal;
   said plurality of pointers being a single pointer when there is agreement between the actual encoded value of the fourth signal and one of the stored pointers wherein the value to be encoded in the fifth signal is the stored value corresponding to said single pointer.

* * * * *